United States Patent
Katz et al.

(10) Patent No.: US 6,265,243 B1
(45) Date of Patent: Jul. 24, 2001

(54) PROCESS FOR FABRICATING ORGANIC CIRCUITS

(75) Inventors: Howard Edan Katz, Summit; Wenjie Li, North Plainfield, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/280,172

(22) Filed: Mar. 29, 1999

(51) Int. Cl.[7] .............................................. H01L 31/0256
(52) U.S. Cl. .................................................... 438/99
(58) Field of Search ................... 427/58; 437/1; 438/99

(56) References Cited

U.S. PATENT DOCUMENTS

| | | |
|---|---|---|
| 4,377,619 | 3/1983 | Schonhorn et al. . |
| 4,483,898 | 11/1984 | Schonhorn et al. . |
| 4,899,249 | 2/1990 | Reilly et al. . |
| 5,266,222 * | 11/1993 | Willis et al. ............... 252/49.006 |
| 5,324,543 | 6/1994 | Ogawa et al. . |
| 5,546,889 * | 8/1996 | Wakita et al. ............... 117/84 |
| 5,571,622 | 11/1996 | Ogawa et al. . |
| 5,580,605 | 12/1996 | Ogawa et al. . |
| 5,667,878 | 9/1997 | Kamen . |
| 5,854,139 * | 12/1998 | Aratani et al. ............... 438/780 |
| 5,998,804 * | 12/1999 | Suh et al. ............... 257/40 |

OTHER PUBLICATIONS

A. Dodabalapur, et al. "Organic Heterostructure Field–Effect Transistors," *Science*, vol. 269, pp. 1560–1562 (1995).

F. Garnier, et al. "Structural basis for high carrier mobility in conjugated oligomers", *Synthetic Metals*, vol. 45, pp. 163–171 (1991).

A.R. Brown, et al. "Logic Gates Made from Polymer Transistors and Their Use in Ring Oscillators", *Science*, vol. 270, pp. 972–974 (1995).

F. Garnier, et al. "All–Polymer Field–Effect Transistor Realized by Printing Techniques", *Science*, vol. 265, pp. 1684–1686 (1994).

A. Dodabalapur, et al. "Organic Heterostructure Field–Effect Transistors", *Science*, vol. 269, pp. 1560–1562 (1995).

H.E. Katz, "Organic molecular solids as thin film transistor semiconductors", *J. Mater. Chem.*, vol. 7, No. 3, pp. 369–376 (1997).

H.E. Katz, et al. "Oligo–and Polythiophene Field Effect Transistors", Chapter 9, Handbook of Oligo–and Polythiophenes, D. Fichou, ed., Wiley–VCH (1999).

A. Dodabalapur, et al. "Complementary circuits with organic transistors", *Appl. Phys. Lett.* vol. 69, No. 27, pp. 4227–4229 (1996).

H.E. Katz, et al. "Synthesis Material Properties, and Transistor Performance of Highly Pure Thiophene Oligomers", *Chem. Mater.*, vol. 7, No. 12, pp. 2235–2237 (1995).

G. Horowitz, et al. "Thin–Film Transistors Based On Alpha-Conjugated Oligomers", *Synthetic Metals*, vol. 41–43, pp. 1127–1130 (1991).

H. E. Katz, et al. "Synthesis And Superior Transistor Performance Of Dopant–Free Thiophene Hexamers", Proceedings of the *American Chemical Society*, vol. 72, pp. 467–469, (1995).

Y.F.Miura, et al. "Wettabilities of Self–Assembled Monolayers Generated from $CF_3$–Terminated Alkanethiols and Gold", *Langmuir*, vol. 14, pp. 5821–5825 (1998).

(List continued on next page.)

Primary Examiner—D. S. Nakarani
Assistant Examiner—D. Lawrence Tarazano
(74) *Attorney, Agent, or Firm*—Scott J. Rittman

(57) ABSTRACT

An organic semiconductor film is fabricated by applying a solution containing an organic semiconductor material and a solvent to a substrate, e.g., by solution casting, and evaporating the solvent. The characteristics of the substrate surface, the organic semiconductor material, and the process parameters are selected to provide desirable nucleation and crystal growth. The resultant organic semiconductor film contains a large area, e.g., a continuous area greater than 1 $cm^2$, that exhibits a relatively high charge carrier mobility of at least about $10^{-4}$ $cm^2 V^{-1} s^{-1}$ at room temperature.

34 Claims, 1 Drawing Sheet

OTHER PUBLICATIONS

F. Garnier, et al. "Dihexylquarterthiophene, A Two-Dimensional Liquid Crystal-like Organic Semiconductor with High Transport Properties", *Chem. Mater*, vol. 10, pp. 3334–3339 (1989).

H. Sirringhaus, et al. "Integrated Optoelectronic Devices Based on Conjugated Polymers", *Science*, vol. 280, pp. 1741–1744 (1998).

Z. Bao, et al. "High–Performance Plastic Transistors Fabricated by Printing Techniques", Chem. Mater. vol. 9, pp. 1299–1301 (1997).

F. Garnier, et al. "Vertical device architecture by molding of organic–based thin film transistor", Applied Physics Letters, vol. 73, No. 12, pp. 1721–1723 (1998).

P. Lang, et al. "Spectroscopic Evidence for a Substrate dependent Orientation of Sexithiophene Thin Films Deposited onto Oriented PTFE", *J. Phys.Chem.*B, 101, pp. 8204–8211 (1997).

P. Damman, et al. "Morphology and NLO properties of thin films of organic compounds obtained by epitaxial growth", *Optical Materials*, vol. 9, pp. 423–429 (1998).

A. Stabel, et al. "Scanning tunnelling microscopy of alkylated oligothiophenes at interfaces with graphite", *Synthetic Metals*, vol. 67, pp. 47–53 (1994).

H.E. Katz, et al. "Synthesis, Solubility, and Field–Effect Mobility of Elongated and Oxa–Substituted $\alpha$, $\omega$–Dialkyl Thiophene Oligomers. Extension of "Polar Intermediate" Synthetic Strategy and Solution Deposition on Transistor Substrates", *Chem. Mater.* vol. 10, pp. 633–638.

H. Akimichi, et al. "Field–effect transistors using alkyl substituted oligothiophenes", *Appl. Phys. Lett.*, vol. 58, No. 14, (1991).

C. Cai, et al. "Self–Assembly in Ultrahigh Vacuum: Growth of Organic Thin Films with a Stable In–Plane Directional Order", *J. Am. Chem. Soc.* vol. 120, pp. 8563–8564 (1998).

P. Damman, et al. "Nucleation and Oriented Growth of Aromatic Crystals on Friction–Transferred Poly(tetrafluoroethylene) Layers", *J. Am. Chem. Soc.* , vol. 119, pp. 4633–4639 (1997).

Y–Y. Lin, et al. "Stacked Pentacene Layer Organic ThinFilm Transistors with Improved Characteristics", *IEEE Electron Device Letters*, vol. 18, No. 12, pp. 606–608 (1997).

C. D. Dimitrakopoulos, et al. "trans–trans–2, 5–Bis–[2–[5–(2,2'–bithienyl)]ethenyl]thiophene: synthesis, characterization, thin film deposition and fabrication of organic field–effect transistors", *Synthetic Metals*, vol. 89, pp. 193–197 (1997).

* cited by examiner

PROCESS FOR FABRICATING ORGANIC CIRCUITS

BACKGROUND OF THE INVENTION

1. Field of the Invention

The invention relates to fabrication of organic circuits such as circuits containing organic thin film transistors.

2. Discussion of the Related Art

Organic thin film transistors (TFTs) are expected to become key components of the plastic circuitry in, among other things, display drivers of portable computers and pagers, and memory elements of transaction cards and identification tags. A typical organic TFT is shown in FIG. 1. The TFT contains a source electrode 10, a drain electrode 12, a gate electrode 14, a gate dielectric 16, a substrate 18, and the semiconductor material 20. When the TFT operates in an accumulation mode, the charges injected from the source 10 into the semiconductor are mobile and conduct the source-drain channel current, mainly in a thin channel region within about 100 Angstroms of the semiconductor-dielectric interface. (See, e.g., M. A. Alam et al., "A Two-Dimensional Simulation of Organic Transistors," *IEEE Transactions on Electron Devices*, Vol. 44, No. 8 (1997).) In the configuration of FIG. 1, the charge need only be injected laterally from the source 10 to form the channel. In the absence of a gate field, the channel ideally has few charge carriers, and there is ideally no source-drain conduction. The off current is defined as the current flowing between the source 10 and the drain 12 when charge has not been intentionally injected into the channel by the application of a gate voltage, and for an accumulation mode TFT, this occurs for a gate-source voltage more positive (for p-channel) or negative (for n-channel) than a certain voltage known as the threshold voltage. (See, e.g., S. M. Sze, *Semiconductor Devices—Physics and Technology*, John Wiley & Sons (1985).) The on current is defined as the current flowing between the source 10 and the drain 12 when the channel is conducting. For a p-channel accumulation-mode TFT, this occurs at a gate-source voltage more negative than the threshold voltage, and for an n-channel accumulation mode TFT, this occurs at gate-source voltage more positive than the threshold voltage. It is desirable for this threshold voltage to be zero, or slightly positive, for n-channel operation. Switching between on and off is accomplished by the application and removal of an electric field from the gate electrode 14 across the gate dielectric 16 to the semiconductor-dielectric interface, effectively charging a capacitor.

One of the most significant factors in bringing such TFTs into commercial use is the ability to deposit organic semiconducting materials on a substrate quickly and easily (i.e., inexpensively), as compared to silicon technology, e.g., by reel-to-reel printing processes. Yet, in order to exhibit suitable electrical properties, the organic materials need to be deposited as thin, uniform, crystalline films, which is a difficult task when using easy, inexpensive processes. (See, e.g., C. Cai et al., "Self Assembly in Ultrahigh Vacuum: Growth of Organic Thin Film with a Stable In-Plane Directional Order," *J. Am. Chem. Soc.*, Vol. 120, 8563 (1998).)

Thus, those in the art have sought to attain the necessary uniformity and order in an organic semiconductor film by the easiest possible fabrication techniques. Cai et al., supra, use an organic molecular beam deposition technique to attain an ordered film, but such a technique is not feasible for large-scale fabrication of organic circuits. Other groups have used a polytetrafluoroethylene layer as a template for an organic semiconductor layer, but the organic material is deposited by a vapor phase method which, again, is unsuitable for inexpensive commercial-scale fabrication. (See, e.g., P. Damman et al., "Morphology and NLO properties of thin films of organic compounds obtained by epitaxial growth," *Optical Materials*, Vol. 9, 423 (1998); and P. Lang et al., "Spectroscopic Evidence for a Substrate Dependent Orientation of Sexithiophene Thin Films Deposited onto Oriented PTFE," *J. Phys. Chem. B*, Vol. 101, 8204 (1997).)

As suggested in Cai et al., supra, liquid phase techniques are the most desirable for fabrication of organic TFTs, since they involve simply providing the organic material in solution, depositing the solution on a substrate, and removing the solvent. Such liquid phase techniques have been somewhat successful for polymeric semiconductor materials, as reflected, for example in Z. Bao et al., "High-Performance Plastic Transistors Fabricated by Printing Techniques," *Chem. Mater.*, Vol. 9, 1299 (1997); and H. Sirringhaus et al., "Integrated Optoelectronic Devices Based on Conjugated Polymers," *Science*, Vol. 280 (1998). However, polymeric semiconductor materials tend to be highly sensitive to the fabrication conditions, are difficult to purify to the extent required for high mobilities and on/off ratios, and exhibit substantial batch-to-batch variability. Oligomeric materials and/or polymers of relatively low molecular weight, and other low molecular weight compounds, tend to be less sensitive and are generally able to be purified such that high, and less environmentally sensitive, mobilities and on/off ratios are possible. Thus, liquid phase techniques for depositing low molecular weight compounds, such as oligomeric semiconductor materials and low molecular weight polymeric materials, are of particular interest.

For example, several groups have experimented with solution casting of thiophene oligomer films, in which a solution of the organic material is essentially dropped onto a substrate, and the solvent is evaporated by heating. However, these processes have generally provided relatively poor uniformity and coverage from such oligomeric solution casting. Relatively large areas, e.g., greater than 1 $cm^2$, exhibiting useful semiconductor properties have thus been difficult to attain. More importantly, the obtained mobilities, even over small areas, have often been unacceptably low or non-uniform compared to films formed by vapor phase techniques. (See, e.g., A. Stabel and J. P. Rabe, "Scanning tunneling microscopy of alkylated oligothiophenes at interfaces with graphite," *Synthetic Metals*, Vol. 67, 47 (1994); H. E. Katz et al., "Synthesis, Solubility, and Field-Effect Mobility of Elongated and Oxa-substituted $\alpha,\omega$-Dialkyl Thiophene Oligomers. Extension of 'Polar Intermediate' Synthetic Strategy and Solution Deposition on Transistor Substrates," *Chemistry of Materials*, Vol. 10, No. 2, 633 (1998); and H. Akimichi et al., "Field-effect transistors using alkyl substituted oligothiophenes," *Appl. Phys. Lett.*, Vol. 58, No. 14, 1500 (1991).)

Spin-coating of oligomeric solutions onto a substrate has been performed more successfully, as reflected in C. D. Dimitrakopoulos et al., "trans-trans-2,5-Bis-[2-{5-(2,2'-bithienyl)} ethenyl]thiophene: synthesis, characterization, thin film deposition and fabrication of organic field-effect transistors," *Synthetic Metals*, Vol. 89, 193 (1997); and F. Garnier et al., "Dihexylquarterthiophene, A Two-Dimensional Liquid Crystal-like Organic Semiconductor with High Transport Properties," *Chem. Mater.*, Vol. 10, 3334 (1998). Spin-coating is wasteful, however, in that much of the solution flies off the substrate. Also, the technique is incompatible with the desired printing fabrication processes for organic TFTs, e.g., reel-to-reel processes on a flexible substrate, and is therefore more of a laboratory technique than a potential commercial process.

Thus, improved methods are desired for forming organic semiconductor films from low molecular weight organic semiconductor compounds. Of particular interest are non-spinning techniques for depositing uniform, ordered organic films from solution.

SUMMARY OF THE INVENTION

A liquid phase technique, advantageously a non-spinning technique such as solution casting, is used to form a crystalline or polycrystalline organic semiconductor film from a solution of a relatively low molecular weight, e.g., oligomeric, organic semiconducting compound. The resultant film exhibits, over a relatively large continuous area of at least 1 cm$^2$, advantageously at least 2 cm$^2$, a desirable charge carrier mobility of at least about $10^{-4}$ cm$^2$V$^{-1}$s$^{-1}$, advantageously at least 5×10$^{-3}$ cm$^2$V$^{-1}$s$^{-1}$ at room temperature. The film advantageously also exhibits an on/off ratio of at least 5, advantageously at least 100.

(As used herein, on/off ratio refers to the ratio of source-drain currents measured for at least one value of the gate voltage less than 100 volts on, and a gate voltage of zero volts off, in air, on a dielectric having a capacitance of about 10$^{-8}$ F/cm$^2$ and a resistivity of at least 10$^{10}$ ohm-cm, for a device operated in the saturation regime, using the same drain voltage to measure both currents. Organic semiconductor film indicates a continuous layer of organic material on a substrate that exhibits, over at least a portion thereof, a charge carrier mobility of at least about 10$^{-8}$ cm$^2$V$^-$s$^{-1}$ at room temperature. Organic semiconductor compound, as used herein, indicates the molecular constituent or constituents of an organic semiconductor film, where all such constituents have a molecular weight less than 1000.)

It has been found that there are several principles to apply in order to successfully fabricate these organic semiconductor films from solutions of low molecular weight organic semiconductor compounds. First, nucleation of crystallites should be substantially restricted to the interface between the solution and the substrate, as opposed to nucleation within the solution. Second, it is desirable to induce solid deposition from solution before the pool of solution unacceptably contracts in area. Third, overly fast crystallite growth at the edges of the pool of solution, relative to deposition across the pool area, should be avoided. Fourth, the film should have a substantially connected morphology rather than isolated crystallites. These principles provide two-dimensional growth across the substrate and high uniformity and order in the resultant films. In one embodiment, these principles are substantially met by using an elevated deposition temperature, a dilute solution, and a substrate having a fluorinated surface. The elevated temperature and dilute solution reduce nucleation within the solution, while the fluorinated surface appears to promote nucleation over the solution-substrate interface.

DETAILED DESCRIPTION OF THE INVENTION

Figure 1:
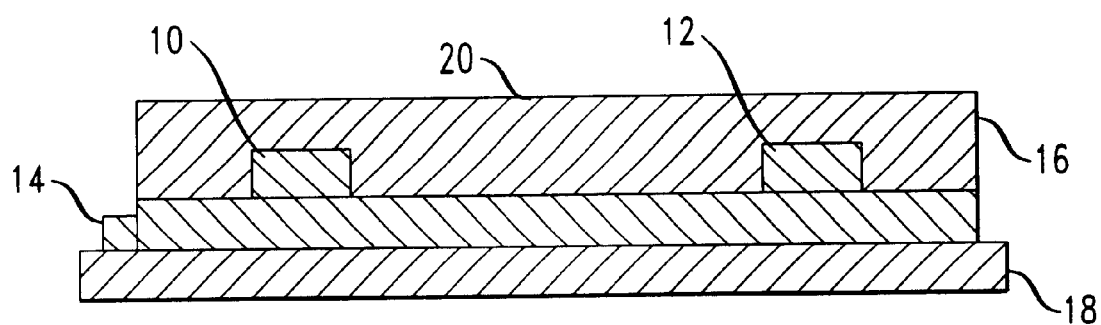
FIG. 1 illustrates a typical organic thin film transistor.

According to the invention, a crystalline or polycrystalline organic semiconductor film is formed by a liquid phase technique from a solution of a relatively low molecular weight, e.g., oligomeric, organic semiconducting compound, advantageously from a non-spinning technique such as solution casting. The process is performed by following four basic principles. First, nucleation of crystallites is substantially restricted to the interface between the solution and the substrate, as opposed to nucleation within the solution. Second, solid deposition from solution begins before the pool of solution unacceptably contracts in area. Third, materials and conditions that cause overly fast crystallite growth at the edges of the pool of solution are avoided. Fourth, the film should have a substantially connected morphology rather than isolated crystallites. The invention applies these principles to successfully fabricate high-quality organic semiconductor films from low molecular weight compounds.

To promote nucleation at the surface-solution interface, as opposed to within the solution, several guidelines are followed. Deposition conditions of high supersaturation are advantageously avoided, such that massive nucleation is unlikely. Temperature is kept relatively high, solutions are kept dilute, and extremely insoluble materials (e.g., a solubility limit of <10 ppm at 100° C.) are avoided. In an exemplary embodiment, the solution poorly wets the substrate surface, e.g., a contact angle of at least 50° (such as by use of a fluorinated surface, as discussed below). A high contact angle allows a large volume of solution to be placed onto a given surface area, making it possible to deposit enough solute from even a dilute solution.

Generally, contraction is also reduced or avoided when the contact angle is high. Specifically, a high contact angle ensures that the pool of solution will not become overly thin at its edges during evaporation. Such thin areas are unstable and tend to contract. However, in some cases, it may be possible to deposit a useful film according to the invention with a low contact angle.

As mentioned above, it is advantageous to use solutes that tend to avoid supersaturation before nucleating. This characteristic is able to be tested by taking a sample of the solution and monitoring whether the solute crystallizes gradually at the temperature or concentration of dissolution or whether the concentration moves past saturation conditions well before crystallization occurs. The latter would suggest that supersaturation occurs before deposition, which would lead to large droplet shrinkage followed by sudden deposition of solid in a small area, neither of which is desirable for fabricating the organic semiconductor films of the invention. Further, preferential wetting of crystallites by the solution, relative to the substrate surface, is desirable because deposited crystallites would then tend to hold the pool of solution in place, thereby inhibiting shrinkage in area. Such preferential wetting would be expected if the contact angle of solution on the deposited material is less than the contact angle of solution on the substrate surface. Moreover, if the solution droplet becomes thin enough while still substantially maintaining its original area coverage, crystal growth would become confined to two-dimensional space, which favors a desirable morphology (in the case of such thinning, it may be possible to obtain a useful film with a low contact angle).

Growth at the edge of a solution pool is determined by rates of nucleation and of enlargement of the crystal nuclei. The variety of factors that influence such nucleation and enlargement have been studied extensively, but the particular relationships have yet to be fully understood. In the invention, however, it has been observed that compounds with more polar or quadrupolar aromatic or heteroaromatic ring systems, such as bithiazole, appear to deposit from solution preferentially, and undesirably, at nuclei formed at a pool boundary, particularly at temperatures only slightly higher than ambient. In contrast, less polar, thiophene systems do not appear to exhibit such preferential nucleation along a pool boundary. A simple test is useful for determining materials suitable for the invention which tend to avoid fast growth at the edge of a solution pool. Specifically, a drop of solution is placed onto a substrate and allowed to evaporate/deposit. If a pronounced ring or rings form, separated by or encircling substantially empty regions, the material system is unlikely to promote the desired uniform, two-dimensional growth, but will instead tend to form distinct aggregates of material.

The desired interconnected morphology is generally attained by meeting the previously-discussed guidelines. In particular, two-dimensional growth provided by avoidance of edge-preferential nucleation contributes to interconnectivity.

Any substrate/solution systems, using a solute of organic material capable of exhibiting semiconductor properties, meeting these principles are expected to provide desirable properties, e.g., an organic semiconductor film exhibiting, over a relatively large continuous area of at least 1 cm$^2$, advantageously at least 2 cm$^2$, a desirable charge carrier mobility of at least about $10^{-4}$ cm$^2$V$^{-1}$s$^{-1}$, advantageously at least $5\times10^{-3}$ cm$^2$V$^{-1}$s$^{-1}$ at room temperature. Advantageously, the uniformity of the continuous area is such that 80% of this continuous area exhibits a charge carrier mobility within a factor of two of the average charge carrier mobility of the continuous area. This continuous area advantageously also exhibits an on/off ratio of at least 5, advantageously at least 100.

Advantageously, a fluorinated organic surface is provided to promote attainment of these principles, particularly when the semiconductor compound is not fluorinated. As mentioned above, fluorination promotes such attainment by decreasing the wettability of the substrate surface, particularly by a non-fluorinated solvent, thereby providing a high contact angle (e.g., at least 50°). To provide the fluorinated substrate, it is possible to treat the surface of a non-fluorinated substrate with a fluorinated compound. Techniques for doing so include dipping the substrate into a reagent that effects the binding of fluorinated groups such as fluoroalkyl chains to the substrate, evaporating such a reagent onto the substrate, or spinning onto a substrate a material containing such groups. It is also possible for these surface-treatment techniques to include removal of solvents or by-products of the binding step, e.g., by vaporization or rinsing. Instead of depositing a fluorinated material onto a substrate, it is also possible to provide a fluorinated substrate material, e.g., a dielectric polymeric material rich in fluoroalkyl chains.

The fluorine concentration on the substrate surface should be sufficient to alter the wetting properties of the substrate surface relative to the solution. In particular, treatment of non-fluorinated substrates by a fluorinated silane has been found to be advantageous, particularly where the fluorinated silane is partially oligomerized prior to application. The partial oligomerization is generally performed either by (a) a reaction with sufficient water to cause a degree of oligomerization of about 1.2 to about 3 (leading to a product referred to as oligomerized), or (b) by partially gelling the silane, e.g., with aqueous HCl, and using the xylene-soluble fraction of the resultant material (leading to a product referred to as partly gelled). (Useful fluorinated silanes contain a silicon atom having $\geq$1 leaving group attached thereto, and an organic group not on the leaving group that provides sufficient CF groups to change the contact angle of a solution by at least 10°.) One such fluorinated silane is $C_8F_{17}C_2H_4Si(OEt)_3$. For fabrication of organic circuits, the substrate is, or has a surface layer of, an insulating material, typically exhibiting an electrical resistivity of at least $10^{10}$ ohm-cm. Insulating materials include, but are not limited to, silicon dioxide, polyimide, and polyvinylphenol.

A variety of low molecular weight organic semiconducting compounds (molecular weight less than 1000) capable of forming an organic semiconducting film are suitable for use in the invention, provided the guidelines discussed herein are able to be met. Some useful compounds are known in the art. Non-polar thiophene oligomers, which are p-type semiconductors, appear to be particularly suitable for use. Specific p-type organic semiconductor compounds useful in the invention, particularly with a fluorinated substrate surface, include α,ω-dihexyl-α-sexithiophene (DHα6T), α,ω-dihexyl-α-quinquethiophene (DHα5T), and α,ω)-bis (3-butoxypropyl)-α6T.

It is also possible to use an n-type organic semiconductor. In particular, as discussed in co-filed, co-assigned application entitled "Device Comprising N-Channel Semiconductor Material" (our reference Katz-Li-Lovinger 31-2-3) it is possible to form useful n-channel films from liquid phase deposition. Contemplated compounds include fused-ring tetracarboxylic diimides, including naphthalene 1,4,5,8 tetracarboxylic acid diimides, naphthalene 2,3,6,7 tetracarboxylic acid diimides, anthracene 2,3,6,7-tetracarboxylic acid diimides, and heterocyclic variants thereof. One advantageous group of compounds is naphthalene 1,4,5,8-tetracarboxylic acid diimides with linear chains of four to twelve saturated atoms, generally carbon atoms, affixed to each of the two imide nitrogens. Advantageously, at least a portion of the substituents on the carbons of the linear chains are fluoro substituents, which appear to improve the capacity for operation in air.

A suitable solvent is selected based on the particular organic semiconducting compound used, as well as the wetting, crystal nucleation, and crystal growth on the substrate surface. Many organic semiconducting materials are relatively insoluble, with a solubility range in a solvent of about 10 to about 1,000 ppm. Moderately polar aromatic solvents are generally used to ensure adequate solubility. (A moderately polar aromatic solvent indicates a compound containing an aromatic or heteroaromatic ring, typically with alkyl and/or halogen substituents.) Suitable solvents include, but are not limited to, toluene, chlorobenzene, 1,2,4-trichlorobenzene, and 3-methylthiophene. Useful solvents for the naphthalene or anthracene based-compounds include moderately polar aromatic solvents containing trifluoromethylphenyl groups.

The device of the invention is typically a circuit containing organic semiconductor films, with such films optionally being the active materials of one or more thin film transistors. (See, e.g., H. E. Katz, "Organic molecular solids as thin film transistor semiconductors," *J. Mater. Chem.*, Vol. 7, No. 3, 369 (1997); and H. E. Katz et al., "Oligo- and Polythiophene Field Effect Transistors," Chapter 9, *Handbook of Oligo-and Polythiophenes*, D. Fichou, ed., Wiley-VCH (1999).) A process for forming such a device involves providing at least one substrate, electrode material and/or dielectric material, and depositing one or more organic semiconductor films onto the substrate, electrode, and/or dielectric. For ease of processing, it is possible to use a substrate of a polymeric insulating material, such as a polyimide. One desirable fabrication process is a reel-to-reel process, in which a continuous sheet of substrate material is advanced in stages, with one or more materials deposited, patterned, or modified at each stage, e.g., by printing techniques. According to the invention, it would be possible to apply a film or pool of a solution containing one or more organic semiconductor compounds, e.g., by dispensing through a valve, by spraying through a nozzle, or by a printing technique, and evaporating the solvent to leave an organic semiconductor film. It is possible to heat the substrate, or provide a vacuum before, during, or after application of the solution. It is thereby possible to form an organic semiconductor film without the need to separate the region of the substrate receiving the film from the rest of the sheet, such that improved process efficiency and lower cost are achieved.

Moreover, using both p-channel and n-channel organic semiconductor materials, it is possible, according to the invention, to fabricate a complementary circuit by liquid phase deposition. (See, e.g., A. Dodabalapur et al., "Complementary circuits with organic transistors," *Appl. Phys. Lett.*, Vol. 69, No. 27, 4227 (1996).) In particular, simple components such as inverters have been realized using complementary circuit architecture. Advantages of complementary circuits, relative to ordinary TFT circuits, include lower power dissipation, longer lifetime, and better tolerance of noise.

The invention will be further clarified by the following examples, which are intended to be exemplary.

EXAMPLES 1 and 2

Procedure:

Semiconductor compounds used were fabricated according to standard techniques. Chlorobenzene and 1,2,4-trichlorobenzene were washed with concentrated sulfuric acid and aqueous sodium carbonate and distilled from $P_2O_5$. Other solvents were the purest available commercial grades.

Substrates were: silicon dioxide (heavily phosphorus-doped (n-type) silicon with 3000 Å of thermal oxide thereon); Amoco polyimide (indium tin oxide glass coated with about 1 to 2 $\mu$m of Amoco ULtradel™ photocurable polyimide, spun from 8% w/v γ-butyrolacetone solution at 1200 rpm, baked for about 1 hour at 130° C., and UV-cured for about 30 minutes); JSR polyimide (about 1 to 2 $\mu$m of JSR Optimer™ AL3046 polyimide, spun from 8% w/v γ-butyrolacetone solution at 1400 rpm, baked for about 1 hour at 120° C.); or polyvinylphenol on $SiO_2$/Si substrates (about 1 to 2 $\mu$m of Aldrich polyvinylphenol with an average molecular weight of ca. 20,000, spun from an 8% w/v acetone solution at 1200 rpm).

Fluorinated surfaces were: fluorinated silane, either partly gelled or oligomerized, the silane deposited by immersing substrates in 1% $C_8F_{17}C_2H_4Si(OEt)_3$ reagent solution in xylene at 80° C. for 10 minutes, followed by rinsing with toluene (oligomerized silane was partially hydrolyzed by heating with a 5% solution of 1.2N HCl in ethanol (containing 0.25 to 0.5 equiv of water), adding 10 volumes of toluene, and reheating to boikl out the ethanol); or fluoroacrylate (provided by spin-coating an overlayer of 3M Fluoroacrylate Coating 722, 2% solution in volatile fluorinated solvents, at 1200 rpm).

Simiconductor films were applied by transferring 0.1 to 0.3 mL of preheated solution with a heated pipette onto substrates that had been thermally equilibrated in a vacuum oven, at temperatures noted below and at atmosperic pressure. A vacuum of about 0.2 atm was pulled for 1 to 2 hours—until the solvent was removed. Gold electrodes were deposited by evaporation through shadow masks. Carbon electrodes were painted from an isopropanol suspension using a paintbrush. Characterization was performed by conventional techniques.

EXAMPLE 1

DHα6T was deposited onto both untreated and fluorinated substrates from chlorobenzene at 60° C.±10° C. For these samples, Table I presents the concentration of the DHα6T in solution, the substrate, the surface coating (if any), the mobility, and the surface area over which the mobility was exhibited.

TABLE I

| Concentration (ppm) | Substrate | Surface Coating | Mobility ($cm^2$/V-sec) | Area exhibiting mobility ($cm^2$) |
|---|---|---|---|---|
| 30 | Amoco PI | — | 0.005–0.1 | <0.2 |
| 50 | Amoco PI | — | ~0.001 | <0.2 |
| 25 | Amoco PI | 3M 722 | 0.05 | 2–3 |
| 50 | Amoco PI | Fluorinated Silane (partly gelled) | 0.003–0.005 | >1 |
| 50 | Amoco PI | Fluorinated Silane (oligomerized) | 0.06–0.08 | >1 |
| 50 | Amoco PI | Octadecyltrimethoxy silane (non-fluorinated) | — | <0.2 |
| 60 | $SiO_2$/Si | — | 0.1 | <0.2 |
| 75 | Amoco PI | Fluorinated Silane (oligomerized) | 0.03 | 2 |

EXAMPLE 2

DHα5T was deposited onto both untreated and fluorinated substrates from several solutions at a concentration of 400 ppm at 60 to 70° C. For the samples, Table II presents the particular solvent, the substrate, the surface coating (if any), the mobility, and the area over which the mobility was exhibited.

TABLE II

| Solvent | Substrate | Surface Coating | Mobility ($cm^2$/V-sec) | Area exhibiting mobility ($cm^2$) |
|---|---|---|---|---|
| Toluene | $SiO_2$/Si | — | ≦0.17 | >1[a] |
| Toluene | $SiO_2$/Si | Fluorinated Silane (oligomerized) | 0.05–0.06 | >1[b] |
| Chlorobenzene | $SiO_2$/Si | — | ≦0.02 | >1[a] |
| Chlorobenzene | $SiO_2$/Si | Fluorinated Silane (oligomerized) | 0.03–0.04 | >1[b] |
| Toluene | JSR PI/$SiO_2$/Si | — | ≦0.03 | 0.5[a] |
| Toluene | JSR PI/$SiO_2$/Si | Fluorinated Silane (oligomerized) | 0.04 | >1[b] |
| Toluene | Polyvinyl-phenol/$SiO_2$/Si | — | ≦0.07 | 0.5[a] |
| Toluene | Polyvinyl-phenol/$SiO_2$/Si | Fluorinated Silane (oligomerized) | 0.06 | >1[b] |
| Chlorobenzene | $SiO_2$/Si | 3M 722 | 0.03–0.04 | 1[b] |

[a]Uneven coverage: some mobilities measured in the film were up to 10 × different from this mobility value.
[b]Even coverage: mobilities measured in various regions of the film were all within a factor of 2 of this mobility value.

EXAMPLE 3

A solution of N,N'-bis(1H,1H-perfluorooctyl) naphthalene-1,4,5,8-tetracarboxylic diimide, 400 parts per million by weight, in α,α,α-trifluorotoluene, was prepared by gentle heating. This solution was cast onto a silicon/$SiO_2$ substrate that had been preheated to about 100° C. The solvent evaporated within about 2 minutes. A 1 $cm^2$ region of the substrate became coated with a thin deposit that showed significant n-channel activity when tested with gold electrodes. The highest mobility obtained was 0.07 $cm^2$/Vs measured in air with a device width/length ratio of 1.7, although other parts of the area showed mobility an order of magnitude lower.

An uncoated region of the substrate was used to cast a film of DHα5T from a 400 ppm toluene solution at 100° C. under vacuum. Gold electrodes were deposited on the thienyl compound. Inverter circuits were constructed by connecting the drain electrode of a diimide device with the drain electrode of a thienyl device, and forming an output contact from the connection. The effective W/L ratio of the thienyl device ranged from 1.7 to 0.1. The output was switched between ±0–10 volts and ±68–98 volts by sweeping the gate over a range of 60 volts and applying a voltage of 100 volts to the source of the thienyl device, or −100 volts to the source of the diimide device. Output voltage differentials as high as 95 volts and gains as high as 10 were observed.

Other embodiments of the invention will be apparent to those skilled in the art from consideration of the specification and practice of the invention disclosed herein.

What is claimed is:

1. A process for fabricating an organic circuit, comprising the steps of:
   providing a substrate, the substrate optionally comprising a polymeric dielectric layer formed thereon;
   providing a solution comprising a solvent and an organic semiconductor compound;
   treating the substrate surface or the dielectric layer surface with a reagent that acts to bind groups onto the surface, wherein the bound groups decrease the wettability of the surface relative to the solution;
   applying the solution to the treated surface by a non-spinning technique, wherein the bound groups on the surface provide for a contact angle between the solution and the surface of at least 50°; and
   evaporating the solvent to form an organic semiconductor film comprising a continuous area greater than 1 cm$^2$ that exhibits a charge carrier mobility of at least about $10^{-4}$ cm$^2$V$^{-1}$s$^{-1}$ at room temperature.

2. The process of claim 1, wherein the continuous area exhibits an on/off ratio of at least 5.

3. The process of claim 1, wherein the continuous area greater than 1 cm$^2$ exhibits a charge carrier mobility of at least about $5\times10^{-3}$ cm$^2$V$^{-1}$s$^{-1}$ at room temperature.

4. The process of claim 1, wherein the bound groups comprise fluorine.

5. The process of claim 4, wherein the bound groups comprise fluoroalkyl chains.

6. The process of claim 1, wherein the substrate comprises the polymeric dielectric layer.

7. The process of claim 1, wherein the organic semiconductor compound is selected from α,ω-dihexyl-α-sexithiophene, α,ω-dihexyl-α-quinquethiophene, α,ω-bis(3-butoxypropyl)-α-sexithiophene, and naphthalene 1,4,5,8 tetracarboxylic acid diimides.

8. The process of claim 1, wherein the film comprises a continuous area greater than 2 cm$^2$ that exhibits a charge carrier mobility of at least about $10^{-4}$ cm$^2$V$^{-1}$s$^{-1}$ at room temperature.

9. The process of claim 8, wherein the continuous area exhibits an on/off ratio of at least 5.

10. The process of claim 1, wherein 80% of the continuous area exhibits a charge carrier mobility within a factor of two of the average charge carrier mobility of the continuous area.

11. The process of claim 1, wherein the solvent is a moderately polar aromatic solvent.

12. The process of claim 11, wherein the solubility of the organic semiconducting material in the solvent is about 10 to about 1,000 ppm.

13. The process of claim 1, wherein the solution is applied by solution casting.

14. The process of claim 13, further comprising at least one of heating the substrate during application and applying a vacuum.

15. A process for fabricating an organic circuit, comprising the steps of:
   providing a solution comprising a solvent and an organic semiconductor compound;
   providing a substrate comprising a polymeric dielectric layer formed thereon, the dielectric layer comprising moieties that decrease the wettability of the dielectric layer relative to the solution, compared to an identical dielectric layer without such moieties;
   applying the solution to the dielectric layer surface by a non-spinning technique, wherein the moieties that decrease the wettability of the dielectric layer provide for a contact angle between the solution and the dielectric layer surface of at least 50°; and
   evaporating the solvent to form an organic semiconductor film comprising a continuous area greater than 1 cm$^2$ that exhibits a charge carrier mobility of at least about $10^{-4}$ cm$^2$V$^{-1}$s$^{-1}$ at room temperature.

16. The process of claim 15, wherein the moieties that decrease the wettability of the dielectric layer are fluorine-containing moieties.

17. The process of claim 16, wherein the moieties are fluoroalkyl chains.

18. The process of claim 15, wherein the continuous area exhibits an on/off ratio of at least 5.

19. The process of claim 15, wherein the continuous area greater than 1 cm$^2$ exhibits a charge carrier mobility of at least about $5\times10^{-3}$ cm$^2$V$^{-1}$s$^{-1}$ at room temperature.

20. The process of claim 15, wherein the organic semiconductor compound is selected from α,ω-dihexyl-α-sexithiophene, α,ωdihexyl-α-quinquethiophene, α,ω-bis(3-butoxypropyl)-α-sexithiophene, and naphthalene 1,4,5,8 tetracarboxylic acid diimides.

21. The process of claim 15, wherein 80% of the continuous area exhibits a charge carrier mobility within a factor of two of the average charge carrier mobility of the continuous area.

22. The process of claim 15, wherein the solvent is a moderately polar aromatic solvent, and wherein the solubility of the organic semiconductor compound in the solvent is about 10 to about 1,000 ppm.

23. The process of claim 15, wherein the solution is applied by solution casting.

24. The process of claim 23, further comprising at least one step selected from heating the substrate during application and applying a vacuum.

25. A process for fabricating an organic circuit, comprising the steps of:
   providing a substrate, the substrate optionally comprising a polymeric dielectric layer formed thereon;
   providing a first solution comprising a solvent and an organic semiconductor compound;
   applying to the surface of the substrate or the surface of the polymeric dielectric layer a second solution comprising a solvent and a compound, and evaporating the solvent from the second solution to form a film of the compound, wherein the film of the compound exhibits a lower wettability relative to the first solution, compared to the substrate surface or the dielectric layer surface;

applying the first solution to the film surface by a non-spinning technique, wherein the contact angle between the first solution and the film surface is at least 50°; and evaporating the solvent from the first solution to form an organic semiconductor film comprising a continuous area greater than 1 cm² that exhibits a charge carrier mobility of at least about $10^{-4}$ cm²V⁻¹s⁻¹ at room temperature.

26. The process of claim 25, wherein the compound that exhibits a lower wettability than the substrate surface or the dielectric layer surface is a fluorinated compound.

27. The process of claim 26, wherein the fluorinated compound is a fluorinated silane.

28. The process of claim 25, wherein the continuous area exhibits an on/off ratio of at least 5.

29. The process of claim 25, wherein the continuous area greater than 1 cm² exhibits a charge carrier mobility of at least about $5 \times 10^{-3}$ cm²V⁻¹s⁻¹ at room temperature.

30. The process of claim 25, wherein the organic semiconductor compound is selected from α,ω-dihexyl-α-sexithiophene, α,ω-dihexyl-α-quinquethiophene, α,ω-bis(3-butoxypropyl)-α-sexithiophene, and naphthalene 1,4,5,8 tetracarboxylic acid diimides.

31. The process of claim 25, wherein 80% of the continuous area exhibits a charge carrier mobility within a factor of two of the average charge carrier mobility of the continuous area.

32. The process of claim 25, wherein the solvent of the second solution is a moderately polar aromatic solvent, and wherein the solubility of the organic semiconductor compound in the solvent of the second solution is about 10 to about 1,000 ppm.

33. The process of claim 25, wherein the solution is applied by solution casting.

34. The process of claim 33, further comprising at least one step selected from heating the substrate during application of the first solution and applying a vacuum.

* * * * *